United States Patent [19]

Kim

[11] Patent Number: 5,412,350
[45] Date of Patent: May 2, 1995

[54] LOW FREQUENCY OSCILLATOR USING CAPACITIVE CHARGING/DISCHARGING

[75] Inventor: Dong-hun Kim, Seoul, Rep. of Korea

[73] Assignee: Samsung Electronics Co., Ltd., Suwon, Rep. of Korea

[21] Appl. No.: 133,229

[22] Filed: Oct. 7, 1993

[30] Foreign Application Priority Data

Oct. 7, 1992 [KR] Rep. of Korea .................... 18406

[51] Int. Cl.[6] ...................... H03K 3/023; H03K 3/282
[52] U.S. Cl. .................... 331/111; 331/113 R; 331/143
[58] Field of Search ................ 331/111, 113, 143, 144

[56] References Cited

U.S. PATENT DOCUMENTS

| | | |
|---|---|---|
| 3,795,893 | 3/1974 | Kritz et al. ............................ 367/91 |
| 4,295,062 | 10/1981 | Mihalich et al. ............... 331/111 X |
| 4,513,258 | 4/1985 | Jamiolkowski et al. ............. 331/111 |
| 4,644,300 | 2/1987 | Ibe et al. ............................. 331/111 |

Primary Examiner—Siegfried H. Grimm
Attorney, Agent, or Firm—Charles R. Donohoe; Robert A. Westerlund, Jr.; Stephen R. Whitt

[57] ABSTRACT

A low-frequency oscillator whose duty ratio can be simply controlled includes a charging and discharging circuit for charging a capacitor via a constant current source and then discharging the capacitor according to a discharge control signal. A voltage comparator compares the voltage across the capacitor with a reference voltage. A monostable multivibrator, triggered by the output of the voltage comparator, generates the discharge control signal. The duration of the discharge is determined according to the RC time constant of the monostable multivibrator, to thereby generate a rectangular waveform having an accurately controlled duty ratio.

6 Claims, 4 Drawing Sheets

LOW FREQUENCY OSCILLATOR USING CAPACITIVE CHARGING/DISCHARGING

BACKGROUND OF THE INVENTION

1. Field of the Invention

The present invention relates to a semiconductor integrated circuit device for low-frequency oscillation, and more particularly, to the low-frequency oscillator for easily controlling the duty ratio of an oscillator output signal.

2. Background of the Related Art

In general, an oscillator adopting a constant current source can obtain the desired pulse waveform by charging and discharging a capacitor according to the lo current from the constant current source. A low-frequency oscillator which uses. constant-current charging and discharging needs a first constant current source for charging the capacitor and a second constant current source for discharging. A conventional low-frequency oscillator is disclosed in U.S. Pat. No. 4,642,579, which embodies a capacitor and resistor on a semiconductor chip.

FIG. 1 is a schematic diagram showing a general low-frequency oscillator, in which the oscillator includes first constant current source 20 second constant current source 21, a Schmitt trigger 22, and a capacitor C. First constant current source 20, which is connected to the power voltage (Vcc), furnishes its output current to terminals of capacitor C, second constant current source 21 and Schmitt trigger 22. The other terminals of capacitor C and second constant current source 21 are grounded. The output of Schmitt trigger 22 is fed back to the second constant current source 21. Node 23 includes a test terminal for monitoring voltage $V_1$ (see FIG. 2) with which capacitor C is charged. Node 24 is an output terminal at which the oscillating output voltage $V_2$ (see FIG. 3) of the Schmitt trigger 22 is detected. In this conventional low-frequency oscillator, first constant current source 20, which is embodied by a PNP transistor, and second constant current source 21, which is embodied by an NPN transistor, are both realized on the same semiconductor chip. A constant current $I_1$ from the first constant current source 20 charges capacitor C until the voltage across the capacitor reaches a high threshold voltage ($V_B$) of Schmitt trigger 22, during which time second constant current source 21 is kept in a state of non-conduction. Upon reaching the high threshold voltage, the output of Schmitt trigger 22 goes high, thereby turning on the second constant current source 21 so that current is discharged via second constant current source 21. This discharging action continues until the charge of capacitor C becomes equal to a low threshold voltage ($V_A$) of Schmitt trigger 22, whereupon the output of Schmitt trigger 22 falls to its low state. Then, second constant current source 21 turns off again and, accordingly, allows capacitor C to be charged again by the first constant current source 20. These steps are successively repeated so that capacitor C is repetitively charged and discharged. The value of the discharged current becomes the difference between the current value $I_1$ of the first current source and the current value $I_2$ of the second current source.

FIG. 2 is a waveform diagram showing the voltage at node 23 of the low-frequency oscillator shown in FIG. 1. The horizontal axis (t) represents time and the vertical axis represents the amplitude of charge voltage $V_1$ in volts. $V_B$ represents the high threshold voltage of Schmitt trigger 22 and $V_A$ its low threshold voltage.

FIG. 3 is a waveform diagram showing the output voltage at output terminal 24 of the Schmitt trigger shown in FIG. 1. The horizontal axis (t) represents time and the vertical axis represents the amplitude of output voltage $V_2$. A rectangular waveform thus results from the output to the Schmitt trigger illustrated in FIG. 2.

As shown in FIGS. 2 and 3, the processes of charging and discharging are repetitive. Time $T_1$ represents the charging duration of capacitor C (from low threshold voltage $V_A$ to high threshold voltage $V_B$) and time $T_2$ represents the discharging duration of the capacitor (from high threshold voltage $V_B$ to low threshold voltage $V_A$). The charging duration is determined by calculating $$T_1 = \frac{C(V_B - V_A)}{I_1} \quad (1)$$

and the discharging duration is determined by calculating $$T_2 = \frac{C(V_B - V_A)}{I_2 - I_1} \quad (2)$$

where the charge and discharge times $T_1$ and $T_2$ are expressed in seconds.

As shown in Equations 1 and 2, controlling the amperage of constant currents $I_1$ and $I_2$ of the first and second constant current sources 20 and 21 play a very important role on determining the periods of $T_1$ and $T_2$. However, the current ratio between the two constant current sources is difficult to control and thus, an accurate duty ratio cannot be obtained simply, because each constant current source (20 and 21) is independently composed of a transistor (PNP or NPN). Thus, unpredictable current irregularities occur due to fluctuations in the supply voltage and the minor amperage differences of the two transistors when initially conducting.

SUMMARY OF THE INVENTION

Therefore, an object of the present invention, for overcoming the aforementioned problem, is to provide a low-frequency oscillator having a simplified circuit configuration that results in a consistent duty ratio that can be easily controlled.

To accomplish the aforementioned and other objects, a low-frequency oscillator according to the present invention comprises charging and discharging means for charging a capacitor via a constant current source and discharging the capacitor according to a discharge control signal voltage comparator for comparing the voltage across the capacitor with a reference voltage; and a monostable multivibrator which is triggered by the output of the voltage comparator so as to generate the discharge control signal, thereby determining the discharging duration according to the RC time constant of the monostable multivibrator. Thus, a rectangular waveform having an accurately controlled duty ratio can be generated.

In the oscillator constructed as above, the charging period is determined by a single current-mirror-type constant current source composed of a PNP transistor, and the discharging period is determined by controlling the RC time constant of a monostable multivibrator. Therefore, the duty ratio of such an oscillator is no longer affected by variations in the characteristics of a constant current source, thus ensuring an accurately controlled duty-ratio.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

The present invention will hereinafter be described in more detail, with reference to the attached drawings.

Figure 1:
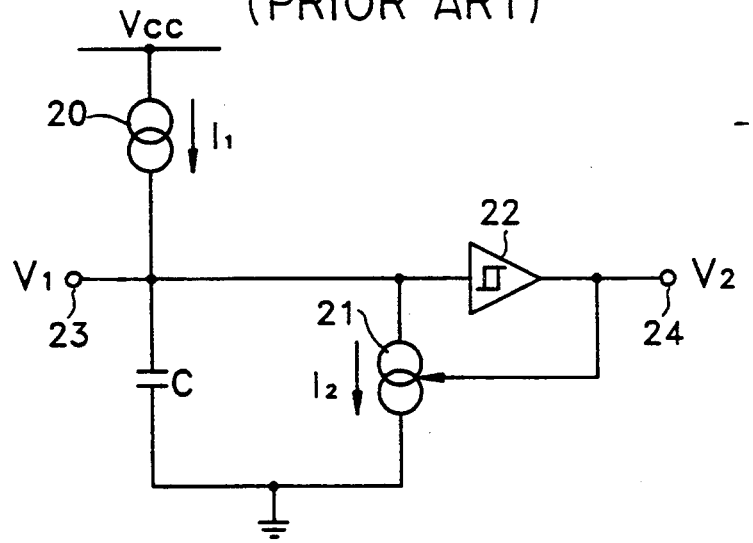
FIG. 1 is a diagram showing a conventional low-frequency oscillator.
Figure 2:
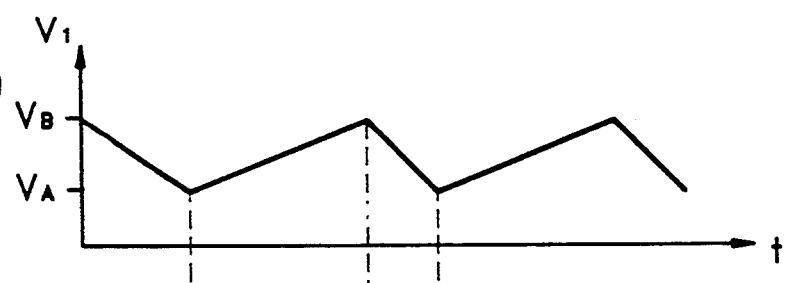
FIG. 2 is a waveform diagram showing the charge voltage present at node 23 of FIG. 1.
Figure 3:
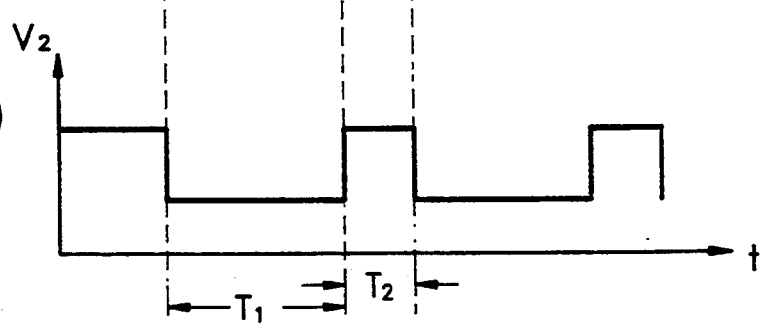
FIG. 3 is a waveform diagram showing the output voltage of the Schmitt trigger of FIG. 1.
Figure 4:
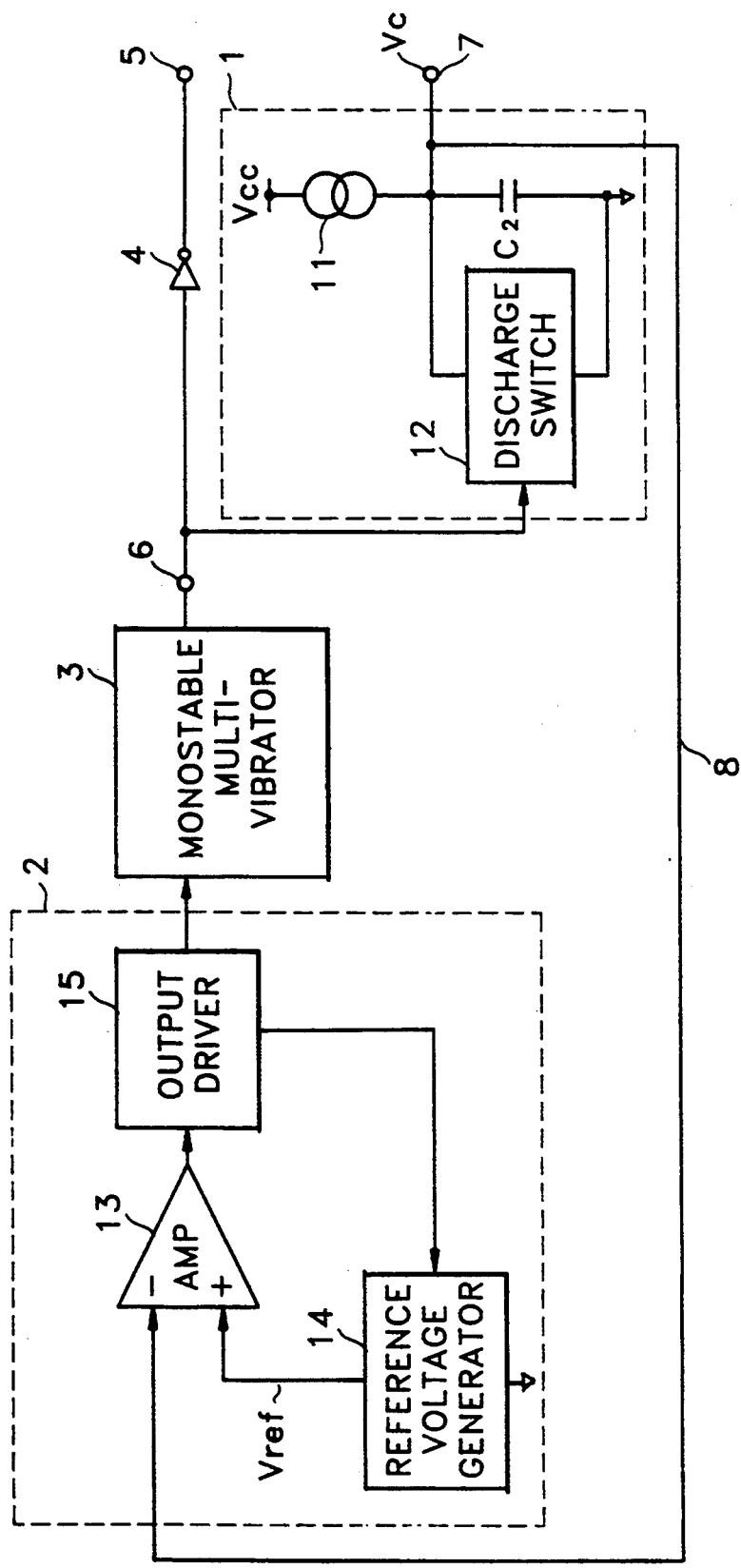
FIG. 4 is a block diagram showing a low-frequency oscillator according to the present invention.

FIG. 4 is a block diagram showing a low-frequency oscillator according to the present invention. The low-frequency oscillator is comprised of a charger/discharger 1, a voltage comparator 2, a monostable multivibrator 3 and an inverter 4. Here, charger/discharger 1 includes a constant current source 11, a capacitor C2 and a discharge switch 12, and voltage comparator 2 includes a differential amplifier 13, a reference voltage generator 14 and an output driver 15.

Constant current source 11 charges capacitor C2 by the current flowing at node 7 which is the point of connection between capacitor C2 and constant current source 11. A charge voltage Vc (node 7) of capacitor C2 is applied via a signal line 8 to the inverting terminal (−) of differential amplifier 13. Differential amplifier 13 compares a reference voltage Vref which is input through the non-inverting terminal (+) with charge voltage Vc, and if charge voltage Vc exceeds reference voltage Vref, causes output driver 15 to trigger monostable multivibrator 3. Controlled by output driver 15, reference voltage generator 14 provides a first reference voltage $Vref_1$ for outputting a high voltage (near Vcc) during the charging of capacitor C2, and generates a second reference voltage $Vref_2$ for outputting a relatively low-voltage as soon as capacitor C2 starts to discharge, thereupon providing the second reference voltage to the non-inverting terminal. Monostable multivibrator 3 is triggered by output driver 15 to a semi-stable state (ordinarily "high") from the stable state (ordinarily "low") and then maintains this state for the duration of the RC time constant determined by an internal resistor-capacitor network, described hereinafter, whereupon it returns to the stable condition. Monostable multivibrator 3 outputs a discharge control signal (node 6) to discharge switch 12 so as to discharge the voltage stored in capacitor C2. In addition, the output of monostable multivibrator 3 is inverted by an inverter 4 and the low-frequency oscillation is output via an output terminal 5. The discharging period Td of capacitor C2 is determined by the duration of the semi-stable state maintained by monostable multivibrator 3.

Figure 5:
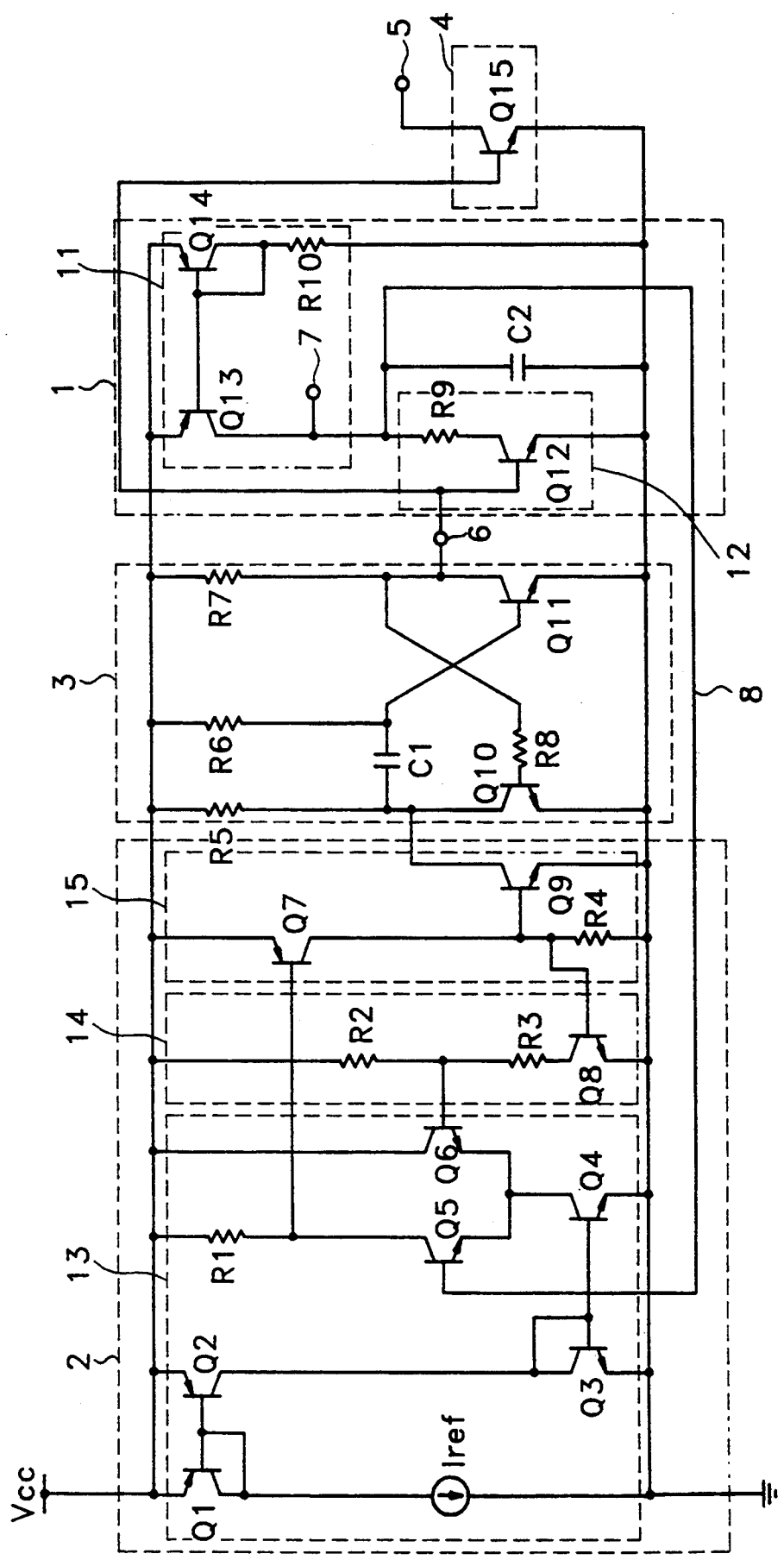
FIG. 5 shows a preferred embodiment of a low-frequency oscillator according to the present invention.

FIG. 5 shows a preferred embodiment of the low-frequency oscillator of FIG. 4 according to the present invention. Here, a current-mirror-type constant current source 11 for charging capacitor C2 of charger/discharger 1 comprises PNP transistors Q13 and Q14, and a resistor R10. The collector of PNP transistor Q13 is connected to one terminal of capacitor C2 whose other terminal is grounded. The base of PNP transistor Q13 is commonly connected with the base and collector of PNP transistor Q14, and grounded via resistor R10. Also, discharge switch 12 of charger/discharger 1 comprises an NPN transistor Q12 and resistor R9. With its emitter grounded, the collector of PNP transistor Q12 is connected via resistor R9 to node 7, which is also a connecting point of both the collector of PNP transistor Q13 and capacitor C2. The output of monostable multivibrator 3 is connected by way of node 6 to the base of NPN transistor Q12. At node 7, the output of charger/discharger 1 is connected to the base of NPN transistor Q5 of comparator 2 for the detection of the charge/discharge voltage level, via line 8.

Differential amplifier 13 of comparator 2 increases the common-mode rejection ratio and has a constant current source connected to the emitter side of NPN transistors Q5 and Q6. The constant current source comprises PNP transistors Q1 and Q2, NPN transistors Q3 and Q4, and a current source Iref. The emitter of NPN transistor Q4 is grounded, while its collector is commonly connected to the emitters of NPN transistors Q5 and Q6 and its base is tied to the common connection of the collector and base of an NPN transistor Q3 and the collector of a PNP transistor Q2. The base of PNP transistor Q2 is tied to the common connection of the collector and base of PNP transistor Q1. Current source Iref can be easily realized by the use of a resistor or some other passively resistive device.

Connected to the base of NPN transistor Q6, reference voltage generator 14 is composed of an NPN transistor Q8 and series resistors R2 and R3. Reference voltage is input to the base of transistor Q6 via resistor R3. Output driver 15 includes a PNP transistor Q7, an NPN transistor Q9 and a resistor R4. The base of PNP transistor Q7 is connected to the collector of NPN transistor Q5, and its collector is connected to one end of resistor R4 and the base of NPN transistor Q9 whose collector is connected to monostable multivibrator 3.

Monostable multivibrator 3 includes NPN transistors Q10 and Q11, resistors R5–R8 and a capacitor C1. The emitters of NPN transistors Q10 and Q11 are both grounded. The collector of NPN transistor Q10 is coupled to the connecting point of resistor R5 and one terminal of capacitor C1 which receives the collector output of NPN transistor Q9. The base of NPN transistor Q10 is coupled to the connecting point of NPN transistor Q 11 and resistor R7 by way of resistor R8 which, via node 6, feeds the base of NPN transistor Q12 of charger/discharger 1. The base of NPN transistor Q11 is commonly connected to the other terminal of capacitor C1 and resistor R6.

Operation of the oscillater of the present invention will now be described. As capacitor C2 is charged by constant current source 11 and thus increasing the voltage at node 7, the base voltage of transistor Q5 of differential amplifier 13 increases accordingly. Whenever the voltage of node 7 exceeds first reference voltage $Vref_1$, transistor Q7 is forward-biased by means of differential amplifier 13, thus making the collector of transistor Q7 go high and in turn loading the forward bias onto the base of transistor Q9 which is instantly turned on so as to trigger monostable multivibrator 3. At this time, transistor Q8 also conducts to cause generation of second reference voltage Vref$_2$ to the base of transistor Q6. Therefore, reference voltage generator 14 generates first reference voltage Vref$_1$ (near Vcc) in the charging duration, and after the discharging starts, it generates second reference voltage Vref$_2$ which is relatively low, in response to the state of the output driver reference signal (collector of transistor Q7).

Once monostable multivibrator 3 is triggered by the output of voltage comparator 2 (at the collector of transistor Q10), the collector of transistor Q11 makes the transition from the stable-state to the semi-stable state. The semi-stable state is maintained for as long as the period Td, which can be determined by the time constant of resistor R6 and capacitor C1, and then charges back to the stable state. Thus, the output of monostable multivibrator 3 is loaded onto the base of transistor Q12 as long as semi-stable state (period Td) occurs, to forward-bias and turn on transistor Q12 of discharge switch 12. Therefore, the charge at node 7 is discharged via resistor R9 and transistor Q12. After the semi-stable state of monostable multivibrator 3 expires, the output of monostable multivibrator 3 returns to the stable-state and transistor Q12 is reverse-biased, which interrupts the discharging so that charging can begin again.

As explained above, charge switch 12 discharges according to the discharge control signal from monostable multivibrator 3, while discharging period Td is determined by the time constant of resistor R6 and capacitor C1. By the discharging process, when the voltage at node 7 becomes lower than second reference voltage Vref$_2$, transistor Q7 of output driver 15 is turned off, which consequently turns off transistors Q9 and Q8. Accordingly, reference voltage generator 14 of comparator 2 provides first reference voltage Vref$_1$, which is high. The output of monostable multivibrator 3 is inverted by inverter 4 composed of transistor Q15 by way of node 6, and then output to output terminal 5.

Accordingly, the repetitive charging and discharging periods of the output waveform can be determined. Discharging period Td is determined by the time constant of resistor R6 and capacitor C1 of monostable multivibrator 3, which is calculated thus:

$$Td = 0.69 \times R6' \times C1' \qquad (3)$$

and the charging period Tc is $$Tc = \frac{(Vm - Vn)C2'}{Ic} \qquad (4)$$

where R6' is the value of resistor R6 in ohms, C1' is the constant current capacity of capacitor C1 in farads, C2' is the constant current capacity of capacitor C2 in farads, Vm is the charge voltage of C2, Vn is the discharge voltage of C2, and Ic is the collector current of transistor Q13 in amperes.

Figure 6:
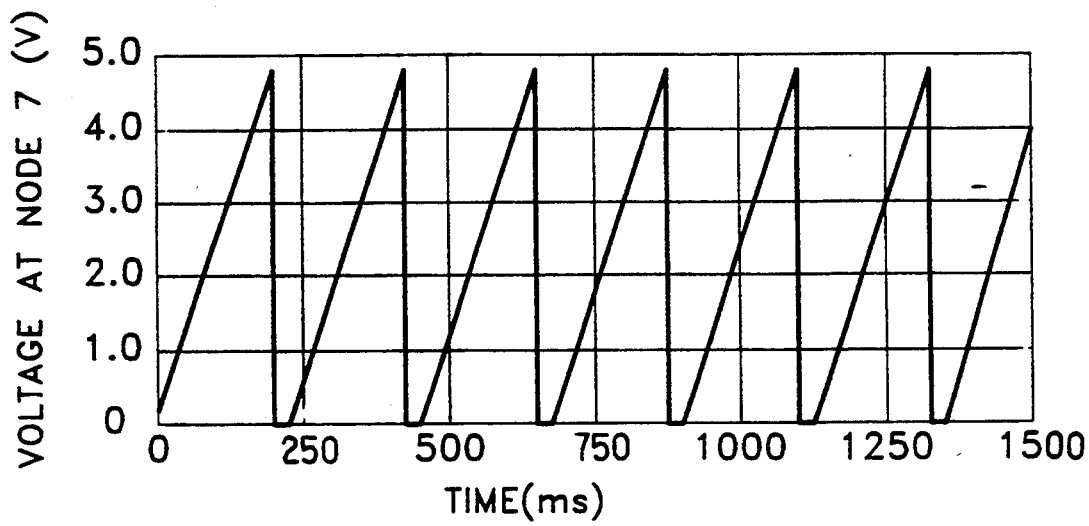
FIG. 6 is a waveform diagram showing the charge voltage at node 7 of FIGS. 4 and 5.

FIG. 6 is a waveform diagram showing the charge voltage at node 7 of FIGS. 4 and 5. Here, the horizontal axis represents time in milliseconds and the vertical axis represents the charge voltage in volts. In FIG. 6, the voltage at node 7 increases from approximately 0 V to nearly +5 V (Vcc) during charging duration Tc, and decreases sharply during discharging duration Td, so that the overall waveform appears as a sawtooth wave. The oscillation is achieved by thus repeating the charging and discharging operations, whose periods are calculated by Equations 3 and 4.

Figure 7:
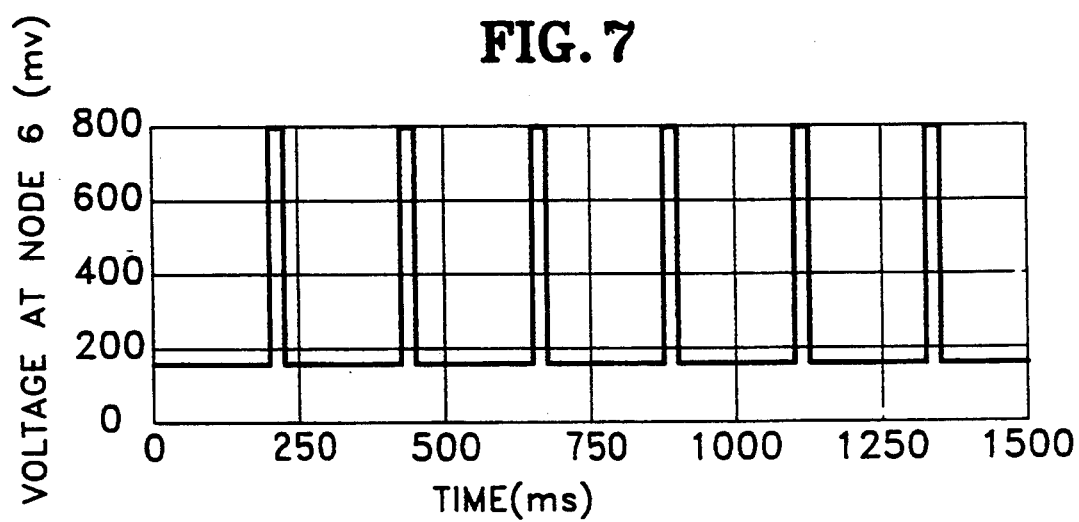
FIG. 7 is a waveform diagram showing the multivibrator output voltage at node 6 of FIGS. 4 and 5.

FIG. 7 is a waveform diagram showing the multivibrator output voltage at node 6 of FIGS. 4 and 5. Here, the horizontal axis represents time in milliseconds and the vertical axis represents the multivibrator output voltage in millivolts. In FIG. 7, the voltage at node 6 maintains a stable-state (low) for the charging duration Tc. However, when the charge voltage at node 7 exceeds the first reference voltage Vref$_1$, monostable multivibrator 3 is triggered, thus changing the voltage at node 6 to a semi-stable state (high) which is maintained for a predetermined time (Td) before returning back to the stable-state. Accordingly, the waveform of FIG. 7 is a rectangular wave which is low during the charging period and high during the discharging period. Moreover, discharging duration Td can be varied by varying the values of resistor R6 and capacitor C1 of monostable multivibrator 3, so that the duty ratio of the rectangular wave output can be simply controlled.

Figure 8:
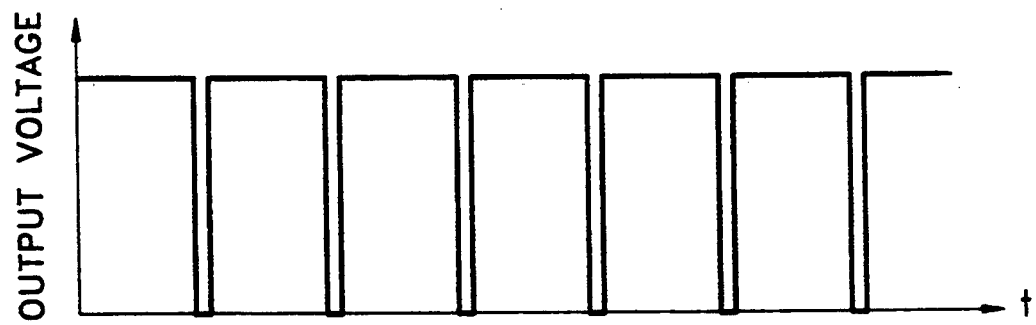
FIG. 8 is a waveform diagram showing the voltage at output terminal 5 of FIGS. 4 and 5.

FIG. 8 is a waveform diagram showing the voltage at output terminal 5, which is the inverse of the signal shown in FIG. 7. Here, the horizontal axis (t) represents time (the same as FIG. 7) while the vertical axis represents the voltage at output terminal 5 which, in this embodiment, is determined by the voltage connected to the output terminal (shown here as an open collector) and thus is merely a representative waveform.

As explained above, the low-frequency oscillator of the present invention determines the charging period according to a single constant current source which is composed of PNP transistors and determines the discharging period by controlling the RC time constant of a monostable multivibrator. Accordingly, duty ratio variations caused by characteristic changes of a conventional constant current source are circumvented, so that a low-frequency oscillator having an accurately controlled duty ratio can be provided.

While there is shown and described the preferred embodiment of the invention, it will be understood by those skilled in the art that foregoing and other changes in form and details may be made without departing from the spirit and scope of the present invention.

What is claimed is:

1. A low-frequency oscillator comprising:
    a charging and discharging circuit that charges a capacitor with a constant current source and discharges said capacitor in response to a discharge control signal;
    a voltage comparator for comparing a voltage across said capacitor with a reference voltage to generate a comparator output; and
    a monostable multivibrator, having a predetermined RC time constant, that is triggered by said comparator output to generate said discharge control signal to cause said discharging of said capacitor for a period determined by said RC time constant;
    said voltage comparator comprising:
        a reference voltage generator for providing said reference voltage and a second reference voltage lower than said reference voltage during said discharging period by said charging and discharging circuit, a differential amplifier for comparing said reference voltage with said voltage across said capacitor and generating a differential output when said voltage across said capacitor exceeds said reference voltage, and an output driver for triggering said monostable multivibrator with said comparator output according to said differential output, said output driver generating an output driver reference signal to initiate generation of said first reference voltage when said voltage across said capacitor discharges to said second reference voltage.

2. A low-frequency oscillator according to claim 1, wherein said charging and discharging circuit comprises:

a current-mirror-type constant current source for providing a predetermined constant current to said capacitor; and a discharge switch for discharging said voltage of said capacitor according to said discharge control signal.

3. A low-frequency oscillator according to claim 1, wherein said output driver reference signal is a rectangular waveform output, a pulse width of said rectangular waveform output can be controlled by varying said predetermined RC time constant of said monostable multivibrator.

4. A low-frequency oscillator comprising:

charging and discharging means for charging capacitor means with a constant current source and for discharging said capacitor means in response to a discharge control signal;

voltage comparator means for comparing a voltage across said capacitor means with a reference voltage to generate a comparator output; and monostable multivibrator means, having a predetermined RC time constant and being triggered by said comparator output, for generating said discharge control signal to cause said discharging of said capacitor means for a period determined by said RC time constant;

said voltage comparator means comprising:

reference voltage generator means for providing said reference voltage as one of a first reference voltage during a charging period of said capacitor means by said charging and discharging means and a second reference voltage lower than said first reference voltage during said discharging period by said charging and discharging means, comparison means for comparing said reference voltage with said voltage across said capacitor means and for generating a differential output when said voltage across said capacitor means exceeds said reference voltage, and output driver means for triggering said monostable multivibrator means with said comparator output according to said differential output, said output driver means generating an output driver reference signal to initiate generation of said first reference voltage when said voltage across said capacitor means discharges to said second reference voltage.

5. A low-frequency oscillator according to claim 4, wherein said charging and discharging means comprises:

a current-mirror-type constant current source for providing a predetermined constant current to said capacitor means; and discharge switch means for discharging said voltage of said capacitor means according to said discharge control signal.

6. A low-frequency oscillator according to claim 4, wherein said output driver reference signal is a rectangular waveform output, a pulse width of said rectangular waveform output being controlled by varying said predetermined RC time constant of said monostable multivibrator means.

* * * * *